United States Patent
Chang

(10) Patent No.: US 7,687,310 B2
(45) Date of Patent: Mar. 30, 2010

(54) METHOD FOR MANUFACTURING PHASE CHANGE MEMORY DEVICE WHICH CAN STABLY FORM AN INTERFACE BETWEEN A LOWER ELECTRODE AND A PHASE CHANGE LAYER

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/855,664

(22) Filed: Sep. 14, 2007

(65) Prior Publication Data
US 2008/0131994 A1 Jun. 5, 2008

(30) Foreign Application Priority Data
Dec. 1, 2006 (KR) ...................... 10-2006-0120920

(51) Int. Cl.
H01L 21/06 (2006.01)
H01L 21/44 (2006.01)

(52) U.S. Cl. ............... 438/102; 438/666; 257/E21.068; 257/E21.071

(58) Field of Classification Search ................. 438/102, 438/666; 257/E21.071, E21.068
See application file for complete search history.

(56) References Cited

U.S. PATENT DOCUMENTS

2004/0132250 A1* 7/2004 Hazani ........................ 438/264
2006/0157683 A1* 7/2006 Scheuerlein ................... 257/4
2006/0169968 A1* 8/2006 Happ ............................. 257/2
2007/0037101 A1* 2/2007 Morioka ..................... 430/313
2008/0042117 A1* 2/2008 Hsu ................................ 257/3
2008/0061341 A1* 3/2008 Lung ........................... 257/303

FOREIGN PATENT DOCUMENTS

KR  1020040087051 A  10/2004
KR  1020060001105 A  1/2006

* cited by examiner

*Primary Examiner*—Hsien-ming Lee
*Assistant Examiner*—Kevin Parendo
(74) *Attorney, Agent, or Firm*—Ladas & Parry LLP

(57) ABSTRACT

A phase change memory device is manufactured by forming a sacrificial layer and a hard mask layer on a lower electrode; performing a first etching these layers and forming on the lower electrode a first stack pattern having a first width less than a width of the lower electrode; performing a second etching the first stack pattern and forming a second stack pattern having a second width less than the first width; forming an insulation to cover the second stack pattern; CMPing the insulation layer to expose the sacrificial layer; removing the sacrificial layer to define a contact hole; forming a lower electrode contact in the contact hole; and forming a phase change layer and an upper electrode on the insulation layer including the lower electrode contact. By manufacturing the phase change memory device in this manner, the size of the contact hole can be decreased and uniformly defined.

6 Claims, 4 Drawing Sheets

METHOD FOR MANUFACTURING PHASE CHANGE MEMORY DEVICE WHICH CAN STABLY FORM AN INTERFACE BETWEEN A LOWER ELECTRODE AND A PHASE CHANGE LAYER

CROSS-REFERENCE TO RELATED APPLICATIONS

The present application claims priority to Korean patent application number 10-2006-0120920 fired on Dec. 1, 2006, which is incorporated herein by reference in its entirety.

BACKGROUND OF THE INVENTION

The present invention relates to a method for manufacturing a phase change memory device, and more particularly, to a method for manufacturing a phase change memory device which can stably form an interface between a lower electrode contact and a phase change layer.

In general, memory devices are largely divided into a volatile RAM (random access memory), which loses inputted information when power is interrupted and a non-volatile ROM (read-only memory), which can continuously maintain the stored state of inputted information even when power is interrupted. When considering the volatile RAM, a DRAM (dynamic RAM) and when considering SRAM (static RAM) can be mentioned, and as the non-volatile ROM, a flash memory device such as an EEPROM (electrically erasable and programmable ROM) can be mentioned.

As is well known in the art, while the DRAM is an excellent memory device, the DRAM must have high charge storing capacity, and to this end, since the surface area of an electrode must be increased, it is difficult to accomplish a high level of integration. Further, in the flash memory device, due to the fact that two gates are stacked on each other, a high operation voltage is required when compared to a source voltage. As a result a separate booster circuit is needed to form the voltage necessary for write and delete operations, making it difficult to accomplish a high level of integration.

To improve upon the current memory devices, researches have been making an effort to develop a novel memory device having a simple configuration and capable of accomplishing a high level of integration while retaining the characteristics of the non-volatile memory device. A phase change memory device recently disclosed in the art is a product of this effort.

In the phase change memory device, a phase change, which occurs in a phase change layer interposed between a lower electrode and an upper electrode from a crystalline state to an amorphous state is due to current flow between the lower electrode and the upper electrode. The information stored in a cell is recognized by the medium of a difference in resistance between the crystalline state and the amorphous state.

In detail, in the phase change memory device, a chalcogenide layer being a compound layer made of germanium (Ge), stibium (Sb) and tellurium (Te) is employed as a phase change layer. As a current is applied, the phase change layer undergoes a phase change by heat, that is, Joule heat, between the amorphous state and the crystalline state. Accordingly, in the phase change memory device, when considering the fact that the specific resistance of the phase change layer in the amorphous state is higher than the specific resistance of the phase change layer in the crystalline state, in a read mode, whether the information stored in a phase change cell has a logic value of '1' or '0' is determined by sensing the current flowing through the phase change layer.

In a conventional phase change memory device, an oxide layer is formed to delimit a contact hole forming region for a lower electrode contact. However, in general, the oxide layer is not uniformly deposited over the entire substrate inducing a step. When etching the oxide layer to define a contact hole, the step on the oxide layer causes the contact hole to be non-uniformly defined, and therefore a lower electrode contact cannot be stably formed in the contact hole. As a result, in the conventional phase change memory device, due to the unstable state of the lower electrode contact, an interface between the lower electrode contact and the phase change layer becomes unstable as well, leading to non-uniformity of a programming current.

Further, in the conventional phase change memory device, due to limitations in the exposure process, it is difficult to form a lower electrode contact having a diameter less than a predetermined diameter. This leads to limitations in reducing the contact area between the lower electrode contact and the phase change layer. If due to the limitation in the exposure process, the diameter of a target lower electrode contact is less than the predetermined diameter, not only it is difficult to properly conduct a process for defining the contact hole for a lower electrode contact, but also the variation of the diameter of the contact hole increases making it difficult to manufacture a phase change memory device having uniform characteristics.

SUMMARY OF THE INVENTION

Embodiments of the present invention are directed to a method for manufacturing a phase change memory device, which can stably form a lower electrode contact so that an interface between the lower electrode contact and a phase change layer can be stably defined.

In one aspect, a method for manufacturing a phase change memory device comprises the steps of forming a first insulation layer having an opening on a semiconductor substrate; forming a lower electrode in the opening; forming a sacrificial layer and a hard mask layer on the lower electrode; performing a first etching the hard mask layer and the sacrificial layer and forming a first stack pattern on the lower electrode, the lower electrode having a first width less than a width of the lower electrode; performing a second etching the first stack pattern and forming a second stack pattern having a second width less than the first width; forming a second insulation layer on the first insulation layer to cover the second stack pattern; CMPing the second insulation layer to expose the sacrificial layer of the second stack pattern; removing the exposed sacrificial layer of the second stack pattern which defines a contact hole in the second insulation layer; forming a lower electrode contact in the contact hole; and forming a phase change layer and an upper electrode on the second insulation layer including the lower electrode contact.

The sacrificial layer is made of any one of a polysilicon layer, a nitride layer, and an oxide layer.

The hard mask layer is made of any one of a nitride layer, an oxide layer, and a polysilicon layer.

The lower electrode contact is made of any one of a tungsten nitride layer, a titanium nitride layer, a titanium tungsten layer, and a titanium aluminum nitride layer, and is formed through atomic layer deposition or chemical vapor deposition.

The upper electrode is made of any one of a tungsten nitride layer, a titanium nitride layer, a titanium tungsten layer, and a titanium aluminum nitride layer.

The second etching comprises a reactive ion etching.

In another aspect, a method for manufacturing a phase change memory device, comprising the steps of: forming a sacrificial layer on the lower electrode; etching the sacrificial layer to form a pattern on the lower electrode; forming an insulation layer to cover the pattern; chemical mechanical polishing (CMPing) the insulation layer to expose the pattern; removing the pattern to define a contact hole in the insulation layer; forming a lower electrode contact in the contact hole; and forming a phase change layer on the second insulation layer and the lower electrode contact.

DESCRIPTION OF SPECIFIC EMBODIMENTS

FIGS. 1A through 1F are cross-sectional views illustrating the process steps of a method for manufacturing a phase change memory device in accordance with an embodiment of the present invention.

Figure 1A:
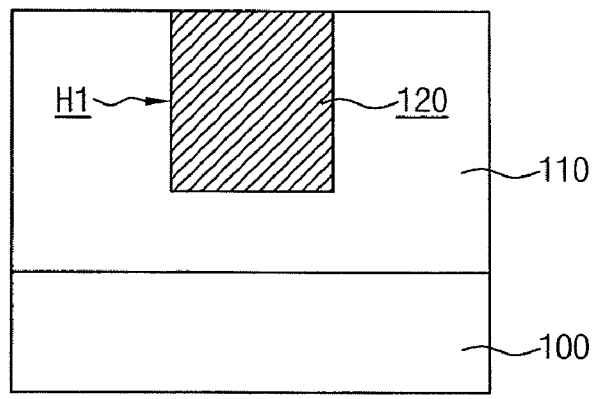
FIGS. 1A through 1F are cross-sectional views illustrating the process steps of a method for manufacturing a phase change memory device in accordance with an embodiment of the present invention.

Referring to FIG. 1A, a first insulation layer 110 is deposited on a semiconductor substrate 100. By etching the first insulation layer 110, an opening H1, which delimits a lower electrode forming region, is defined. A conductive layer for a lower electrode is deposited on the first insulation layer 110 in such a way as to fill the opening H1. The conductive layer is then CMPed (chemical mechanical polished), and a lower electrode 120 is formed in the opening H1.

Figure 1B:
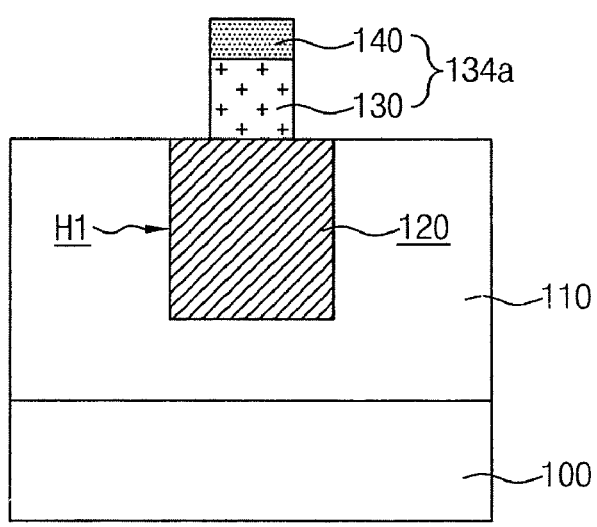

Referring to FIG. 1B, a sacrificial layer 130 and a hard mask layer 140 are deposited on the lower electrode 120. The sacrificial layer 130 is made of any one of a polysilicon layer, a nitride layer, and an oxide layer. The hard mask layer 140 is made of any one of a nitride layer, an oxide layer, and a polysilicon layer. After forming a photoresist pattern (not shown) on the hard mask layer 140, the hard mask layer 140 and the sacrificial layer 130 are etched using the photoresist pattern forming a first stack pattern 134a, which has a first width less than the width of the lower electrode 120.

Figure 1C:
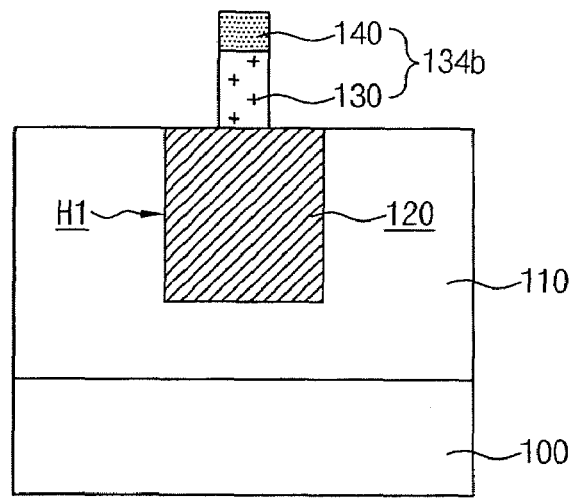

Referring to FIG. 1C, by reactive ion etching the first stack pattern 134a, a second stack pattern 134b, which has a second width less than the first width, is formed.

Figure 1D:
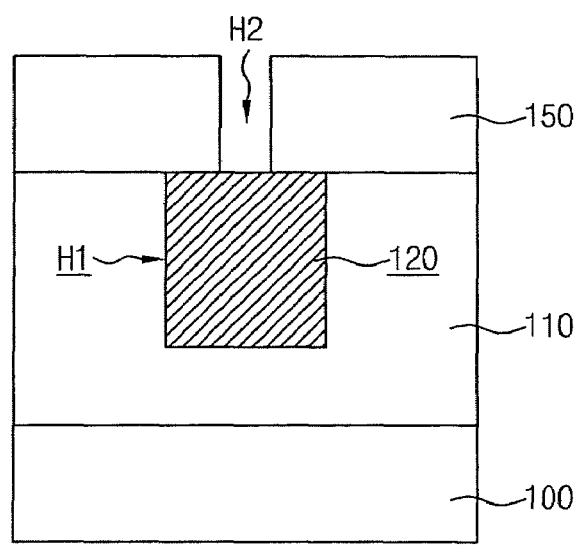

Referring to FIG. 1D, with the photoresist pattern removed, a second insulation layer 150 is deposited on the first insulation layer 110 and the lower electrode 120 in such a way as to cover the second stack pattern 134b. The second insulation layer 150 is CMPed until the sacrificial layer 130 of the second stack pattern 134b is exposed. The exposed sacrificial layer 130 of the second stack pattern 134b is removed, defining a contact hole H2 in the second insulation layer 150.

Figure 1E:
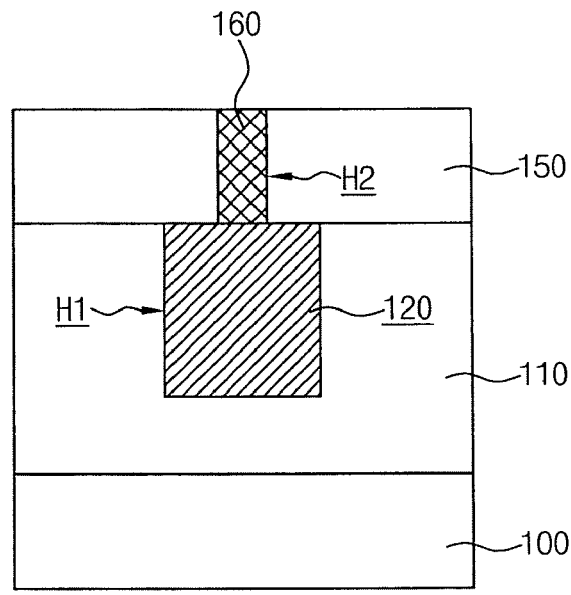

Referring to FIG. 1E, a conductive layer for a lower electrode contact is deposited on the second insulation layer 150 in such a way as to fill the contact hole H2. The conductive layer for the lower electrode contact is deposited through ALD (atomic layer deposition) or CVD (chemical vapor deposition) and is made of any one of a tungsten nitride layer (WN layer), a titanium nitride layer (TiN layer), a titanium tungsten layer (TiW layer), and a titanium aluminum nitride layer (TiAlN layer). By CMPing the conductive layer for a lower electrode contact, a lower electrode contact 160 is formed in the contact hole H2.

Here, in the present invention, by forming the sacrificial layer 130 and the hard mask layer 140 and then reactive ion etching these two layers, it is possible to both decrease the size of the contact hole H2 and uniformly define the contact hole H2. That is to say, after the sacrificial layer 130 and the hard mask layer 140 are formed, since the two etching processes (the etching using the photoresist pattern and the reactive ion etching) are conducted on the sacrificial layer 130 and the hard mask layer 140, the size of the contact hole H2, in which the lower electrode contact 160 is formed, can be decreased. The contact area between the lower electrode and a phase change layer is therefore decreased, whereby a current needed for a phase change can be lowered and an operation speed can be elevated. Also, by forming the sacrificial layer 130 and the hard mask layer 140, the contact hole H2 can be uniformly defined, and due to the uniformly defined contact hole, the lower electrode contact 160 can be stably formed.

As described above, in the present invention, since the lower electrode contact is stably formed, a uniform interface between the lower electrode contact 160 and the phase change layer can be obtained, and uniformity of a programming current can be ensured.

Figure 1F:
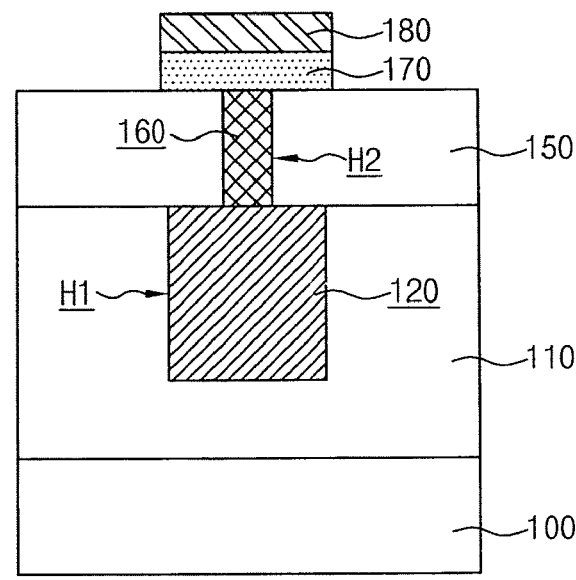

Referring to FIG. 1F, a phase change material layer and a conductive layer for an upper electrode are deposited on the second insulation layer 150 and the lower electrode contact 160. The conductive layer for an upper electrode is made of any one of a tungsten nitride layer (WN layer), a titanium nitride layer (TiN layer), a titanium tungsten layer (TiW layer), and a titanium aluminum nitride layer (TiAlN layer). By etching the conductive layer for an upper electrode and the phase change material layer, a phase change layer 170 and an upper electrode 180 are formed on the second insulation layer 150 and the lower electrode contact 160.

Thereafter, while not shown in the drawings, by sequentially implementing a series of subsequent well-known processes, the manufacture of a phase change memory device according to the embodiment of the present invention is completed.

Figure 2:
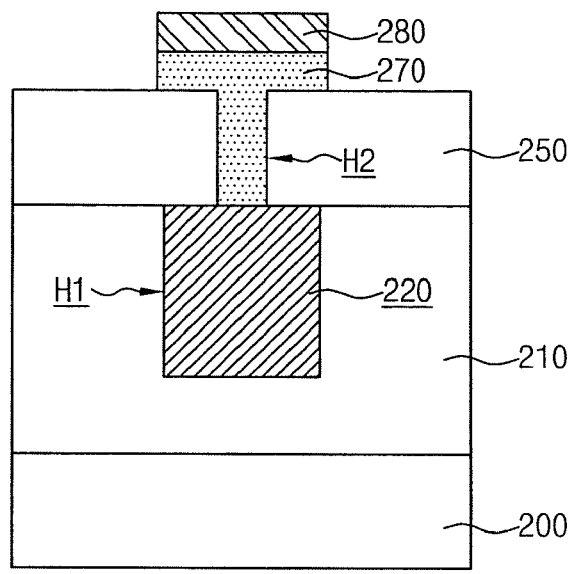
FIG. 2 is a cross-sectional view illustrating a phase-change memory device in accordance with another embodiment of the present invention.

In the above-described embodiment, after the lower electrode contact 160 is formed in the contact hole H2, the phase change layer 170 and the upper electrode 180 are formed on the second insulation layer 150 and the lower electrode contact 160. However, in another embodiment of the present invention, as shown in FIG. 2, a phase change layer 270 can be formed on a second insulation layer 250, and in the contact hole H2. Even in this case, the same effects as those of the aforementioned embodiment can be obtained.

In FIG. 2, the unexplained reference numeral 200 designates a semiconductor substrate, 210 a first insulation layer, 220 a lower electrode, and 280 an upper electrode. The unexplained reference symbol H1 designates an opening for delimiting a lower electrode forming region.

Figure 3:
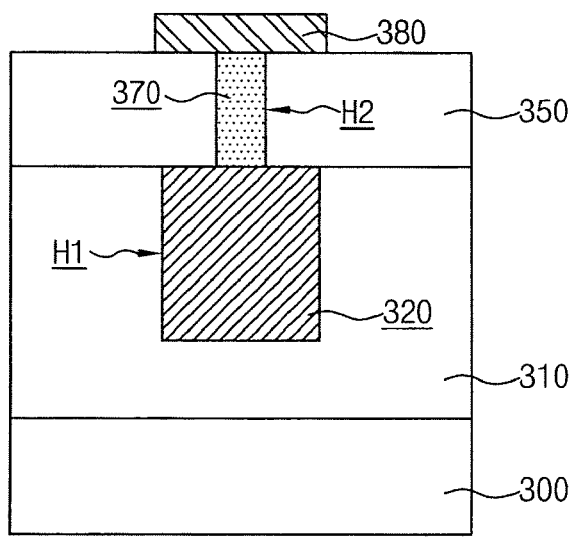
FIG. 3 is a cross-sectional view illustrating a phase-change memory device in accordance with still another embodiment of the present invention.

Referring to FIG. 3, in still another embodiment of the present invention, after forming a phase change layer 370 by filling a phase change material in a contact hole H2, an upper electrode 380 can be formed on the phase change layer 370 and the second insulation layer 350. Even in this embodiment, the same effects as those of the above-mentioned embodiments can be obtained.

In FIG. 3, the unexplained reference numeral 300 designates a semiconductor substrate, 310 a first insulation layer, and 320 a lower electrode. The unexplained reference symbol H1 designates an opening for delimiting a lower electrode forming region.

As is apparent from the above description, in the present invention, due to the fact that a stack pattern composed of a sacrificial layer and a hard mask layer is formed and reactive ion etching is conducted on the stack pattern, the size of a contact hole, in which a lower electrode contact is formed, can be decreased, and the contact hole can be uniformly defined.

Consequently, in the present invention, as the size of the contact hole is decreased, the size of the lower electrode contact is also decreased, and a contact area between a lower electrode and a phase change layer can be reduced, whereby a current needed for a phase change can be lowered and an operation speed can be elevated.

Moreover, in the present invention, as the contact hole is uniformly defined, the lower electrode contact can be stably formed, and an interface between the lower electrode contact and the phase change layer can be uniformly defined, whereby uniformity of a programming current can be ensured.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a phase change memory device, comprising the steps of:
    forming a first insulation layer on a semiconductor substrate, the first insulation layer having an opening;
    forming a lower electrode in the opening;
    forming a sacrificial layer and a hard mask layer on the lower electrode;
    performing a first etching using a first etching process on the hard mask layer and the sacrificial layer to form a first stack pattern on the lower electrode, the first stack pattern having a first width less than a width of the lower electrode, wherein the first etching process is performed using a photoresist pattern;
    performing a second etching using a second etching process on the sacrificial layer and the hard mask layer of the first stack pattern to form a second stack pattern of the sacrificial layer and the hard mask layer which has a second width less than the first width, wherein the second etching process is a different etching process than the first etching process, and the second etching process is a reactive ion etching process;
    forming a second insulation layer on the first insulation layer to cover the second stack pattern;
    chemical mechanical polishing the second insulation layer to expose the sacrificial layer of the second stack pattern;
    removing the exposed sacrificial layer of the second stack pattern to define a contact hole in the second insulation layer;
    forming a lower electrode contact in the contact hole; and
    forming a phase change layer and an upper electrode on the second insulation layer and the lower electrode contact.

2. The method according to claim 1, wherein the sacrificial layer is made of any one of a polysilicon layer, a nitride layer, and an oxide layer.

3. The method according to claim 1, wherein the hard mask layer is made of any one of a nitride layer, an oxide layer, and a polysilicon layer.

4. The method according to claim 1, wherein the lower electrode contact is made of any one of a tungsten nitride layer, a titanium nitride layer, a titanium tungsten layer, and a titanium aluminum nitride layer.

5. The method according to claim 4, wherein the lower electrode contact is formed through atomic layer deposition or chemical vapor deposition.

6. The method according to claim 1, wherein the upper electrode is made of any one of a tungsten nitride layer, a titanium nitride layer, a titanium tungsten layer, and a titanium aluminum nitride layer.

* * * * *